US008686400B2

(12) United States Patent
Moon (10) Patent No.: US 8,686,400 B2
(45) Date of Patent: Apr. 1, 2014

(54) LIGHT EMITTING DEVICE HAVING A LIGHT EMITTING STRUCTURE INCLUDING AN INTERFACE LAYER

(75) Inventor: Yong Tae Moon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 100 days.

(21) Appl. No.: 13/182,879

(22) Filed: Jul. 14, 2011

(65) Prior Publication Data

US 2012/0012815 A1    Jan. 19, 2012

(30) Foreign Application Priority Data

Jul. 16, 2010  (KR) .......................... 10-2010-0068937
Jul. 16, 2010  (KR) .......................... 10-2010-0068938

(51) Int. Cl.
*H01L 29/06* (2006.01)
*H01L 33/00* (2010.01)

(52) U.S. Cl.
USPC .............................................. 257/14; 257/96

(58) Field of Classification Search
USPC ....................................................... 257/11, 14
See application file for complete search history.

(56) References Cited

U.S. PATENT DOCUMENTS

| 6,555,403 | B1 * | 4/2003 | Domen et al. ................... 438/22 |
| 6,586,762 | B2 * | 7/2003 | Kozaki .............................. 257/14 |
| 7,283,313 | B2 * | 10/2007 | Tamaoki et al. ............... 359/726 |
| 7,667,226 | B2 * | 2/2010 | Yanamoto ......................... 257/14 |
| 7,745,841 | B2 * | 6/2010 | Kuramoto ......................... 257/96 |
| 8,035,113 | B2 * | 10/2011 | Moustakas et al. ............. 257/79 |
| 8,106,403 | B2 * | 1/2012 | McLaurin ......................... 257/79 |
| 8,222,658 | B2 * | 7/2012 | Shinagawa et al. ............. 257/96 |
| 8,502,266 | B2 * | 8/2013 | Kim et al. ....................... 257/103 |
| 2001/0002048 | A1 * | 5/2001 | Koike et al. ..................... 257/80 |
| 2008/0203418 | A1 | 8/2008 | Yanamoto ......................... 257/98 |
| 2008/0251781 | A1 | 10/2008 | Han et al. ......................... 257/13 |
| 2009/0162999 | A1 * | 6/2009 | Lin et al. ....................... 438/483 |
| 2011/0084249 | A1 | 4/2011 | Oh et al. ........................... 257/13 |
| 2011/0284821 | A1 * | 11/2011 | Moon et al. ..................... 257/13 |

FOREIGN PATENT DOCUMENTS

| CN | 1525578 | 9/2004 |
| CN | 101761795 | 6/2010 |
| EP | 1 619 729 | 1/2006 |
| EP | 1 883 121 | 1/2008 |
| JP | 2555983 | 11/1996 |
| JP | 2000-091705 A | 3/2000 |
| KR | 10-2006-003713 A | 5/2006 |
| KR | 10-2006-0053470 A | 5/2006 |
| KR | 10-0753518 B1 | 8/2007 |
| KR | 10-2008-0010136 A | 1/2008 |

(Continued)

*Primary Examiner* — William D Coleman
(74) *Attorney, Agent, or Firm* — KED & Associates, LLP (57) ABSTRACT

Disclosed herein is a light emitting device including a light emitting structure including a first conductivity-type semiconductor layer, a second conductivity-type semiconductor layer, and an active layer including at least one combination of a well layer of a first composition formed of a nitride-semiconductor material having first electronic energy and a barrier layer of a second composition formed of a nitride-semiconductor material having higher electronic energy than the first electronic energy, and an interface layer disposed between the second conductivity-type semiconductor layer and the active layer or between the first conductivity-type semiconductor layer and the active layer. The interface layer includes first, second and third layers having different energy bandgaps, the energy bandgaps of the first and second layers are greater than the energy bandgap of the barrier layer, and the energy bandgap of the third layer is less than the energy bandgap of the barrier layer.

20 Claims, 6 Drawing Sheets

(56) References Cited

FOREIGN PATENT DOCUMENTS

| KR | 10-0826422 B1 | 4/2008 |
| KR | 10-2008-0090669 A | 10/2008 |
| KR | 10-2009-0109340 | 10/2009 |
| KR | 10-2009-0109340 A | 10/2009 |
| KR | 10-2009-0117538 A | 11/2009 |
| KR | 10-2011-0090118 A | 8/2011 |

* cited by examiner

LIGHT EMITTING DEVICE HAVING A LIGHT EMITTING STRUCTURE INCLUDING AN INTERFACE LAYER

This application claims the benefit of Korean Patent Application No. 10-2010-0068938 and 10-2010-0068937, filed on 16 Jul. 2010, which is hereby incorporated in its entirety by reference as if fully set forth herein.

BACKGROUND OF THE INVENTION

1. Field of the Invention

Embodiments relate to a light emitting device.

2. Discussion of the Related Art

Light emitting devices including light emitting diodes using group III-V or II-VI compound semiconductor materials generate light of various colors, such as red, green, blue, and ultraviolet light, due to development of thin film growth techniques and device materials, and generate white light having high efficiency using fluorescent materials or through color mixing. Further, the light emitting devices have advantages, such as low power consumption, semi-permanent lifespan, rapid response time, stability, and environmentally friendliness as compared to conventional light sources, such as fluorescent lamps and incandescent lamps.

Therefore, these light emitting devices are increasingly applied to transmission modules of optical communication units, light emitting diode backlight units substituting for cold cathode fluorescent lamps (CCFLs) constituting backlight units of liquid crystal display (LCD) devices, lighting apparatuses using white light emitting diodes substituting for fluorescent lamps or incandescent lamps, head lights for vehicles and traffic lights.

SUMMARY OF THE INVENTION

Accordingly, embodiments are directed to a light emitting device.

The embodiments are to provide a light emitting device.

The embodiments will be set forth in part in the description which follows and in part will become apparent to those having ordinary skill in the art upon examination of the following or may be learned from practice of the embodiments. The embodiments may be realized and attained by the structure particularly pointed out in the written description and claims hereof as well as the appended drawings.

As embodied and broadly described herein, a light emitting device includes a light emitting structure including a first conductivity-type semiconductor layer, a second conductivity-type semiconductor layer, and an active layer including at least one combination of a well layer of a first composition formed of a nitride-semiconductor material having first electronic energy and a barrier layer of a second composition formed of a nitride-semiconductor material having higher electronic energy than the first electronic energy between the first conductivity-type semiconductor layer and the second conductivity-type semiconductor layer and configured such that the well layer and the barrier layer are alternately stacked vertically, and an interface layer disposed between the second conductivity-type semiconductor layer and the active layer or between the first conductivity-type semiconductor layer and the active layer, wherein the interface layer includes a first layer, a second layer and a third layer having different energy bandgaps, the energy bandgaps of the first layer and the second layer are greater than the energy bandgap of the barrier layer in the active layer, and the energy bandgap of the third layer is less than the energy bandgap of the barrier layer in the active layer.

The energy bandgap of the first layer may be greater than the energy bandgap of the second layer.

An in-plane lattice constant of at least one of the first layer, the second layer and the third layer may be greater than an in-plane lattice constant of the barrier layer in the active layer.

The in-plane lattice constant of at least one of the first layer, the second layer and the third layer may be equal to an in-plane lattice constant of the barrier layer in the active layer.

An average in-plane lattice constant of the interface layer may be greater than an in-plane lattice constant of the barrier layer in the active layer.

An average in-plane lattice constant of the interface layer may be equal to an in-plane lattice constant of the barrier layer in the active layer.

The first layer, the second layer and the third layer of the interface layer may be sequentially disposed in a direction from the active layer towards the second conductivity-type semiconductor layer or the first conductivity-type semiconductor layer.

The first layer may be further disposed after the first layer, the second layer and the third layer are sequentially disposed.

The first layer of the interface layer may contact the active layer.

The light emitting device may further include a barrier layer provided between the active layer and the interface layer.

Each of the first layer, the second layer and the third layer may have a formula of $Al_xIn_yGa_{1-x-y}N$ (here, $0 \le x, y \le 1$).

Each of the first layer and the second layer may have a formula of $Al_xIn_yGa_{1-x-y}N$ (here, $0 \le y \le 0.82$, $0 \le x \le 0.43$).

Each of the first layer and the second layer may have an energy bandgap of 3.4~4.7 eV.

Each of the first layer and the second layer may have an in-plane lattice constant of 3.185~3.2875 Å.

The first layer may have a thickness of 1~10 nm.

The sum total of thicknesses of the first layer and the second layer may be more than 5 nm.

The sum total of thicknesses of the first layer, the second layer and the third layer may be more than 10 nm.

The first conductivity-type semiconductor layer may be an N-type semiconductor layer and the second conductivity-type semiconductor layer may be a P-type semiconductor layer, or the first conductivity-type semiconductor layer may be a P-type semiconductor layer and the second conductivity-type semiconductor layer may be an N-type semiconductor layer.

In another aspect of the embodiments a light emitting device package includes the above light emitting device.

In yet another aspect of the embodiments, a lighting system includes a circuit board, the above light emitting device provided on the circuit board, and an optical guide to guide light emitted from the light emitting device.

It is to be understood that both the foregoing general description and the following detailed description of the embodiments are exemplary and explanatory and are intended to provide further explanation of the embodiments as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE INVENTION

Reference will now be made in detail to the embodiments of the present invention, examples of which are illustrated in the accompanying drawings. Wherever possible, the same reference numbers will be used throughout the drawings to refer to the same or like parts.

It will be understood that when respective layers (films), regions, patterns or structures are referred to as being 'on' or 'under' a substrate, respective layers (films), regions, pads or patterns, it can be directly on/under the elements, and one or more intervening elements may also be present. When an element is referred to as being 'on' or 'under', 'under the element' as well as 'on the element' will be described based on the drawings.

In the drawings, the thicknesses or sizes of respective layers are exaggerated, omitted, or schematically illustrated for convenience and clarity of description. Further, the sizes of the respective elements do not denote the actual sizes thereof.

Figure 1:
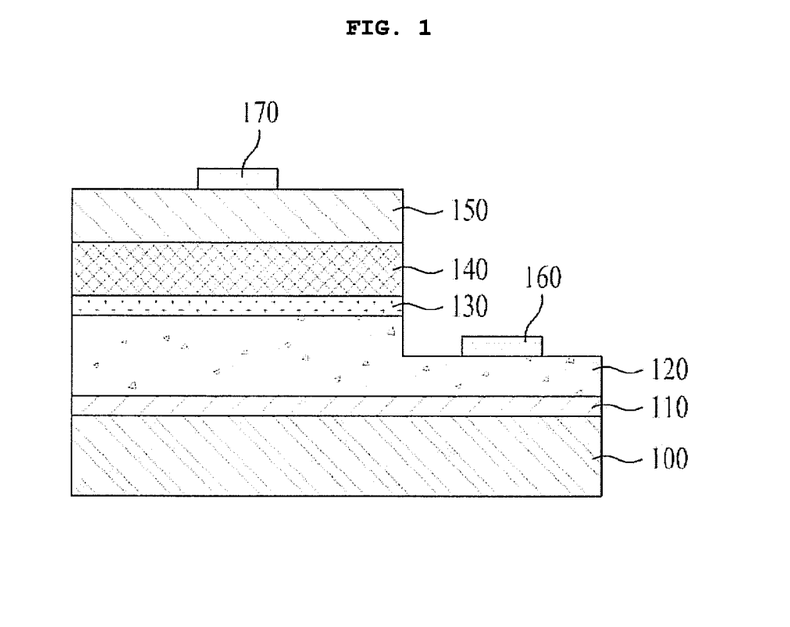
FIG. 1 is a cross-sectional view illustrating a light emitting device in accordance with one embodiment of the present invention.
Figure 2:
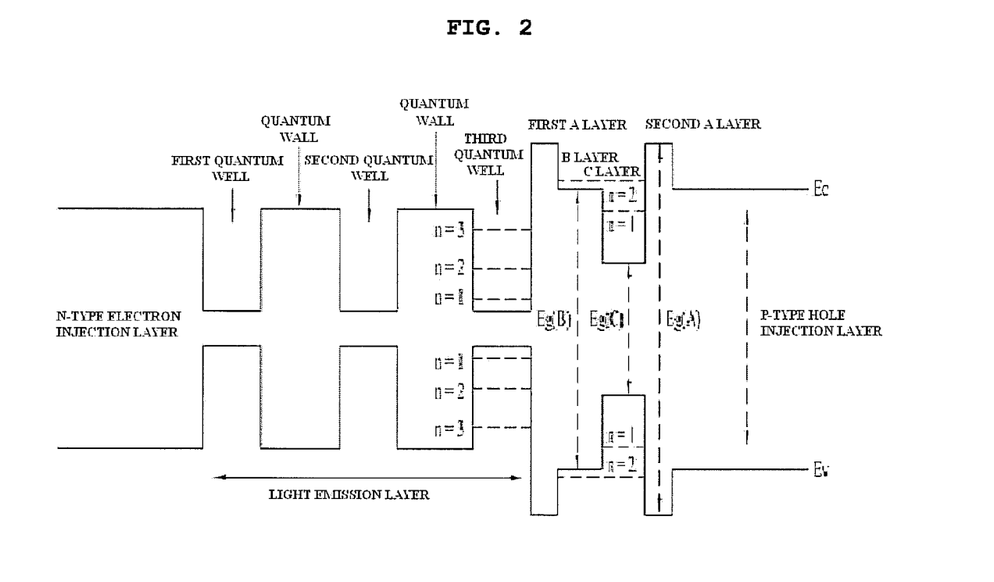
FIG. 2 is a schematic view illustrating an energy bandgap of the light emitting device in accordance with the embodiment of the present invention.
Figure 4:
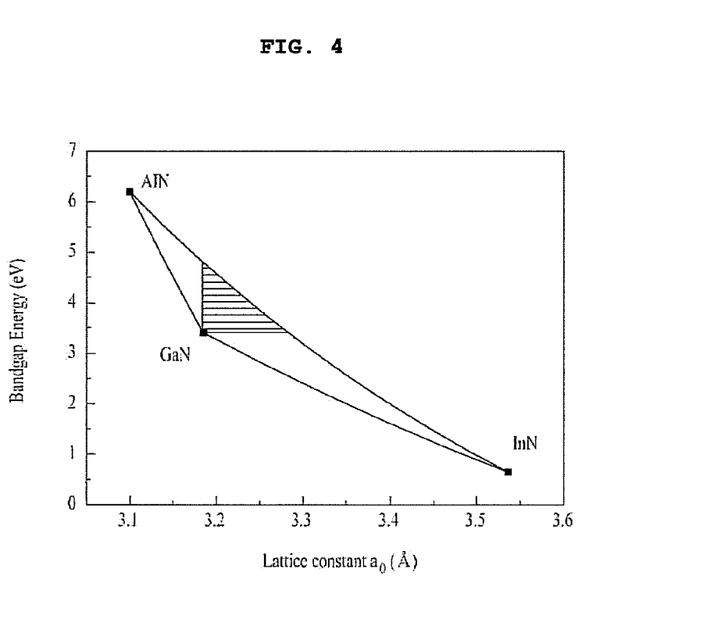
FIG. 4 is a graph illustrating characteristics of a nitride in an interface layer of the light emitting device.

FIG. 1 is a cross-sectional view illustrating a light emitting device in accordance with one embodiment of the present invention, FIG. 2 is a schematic view illustrating an energy bandgap of the light emitting device in accordance with the embodiment of the present invention, and FIG. 4 is a graph illustrating characteristics of a nitride in an interface layer of the light emitting device. Hereinafter, the light emitting device in accordance with this embodiment of the present invention will be described with reference to FIGS. 1, 2 and 4.

As shown in FIGS. 1, 2 and 4, a first conductivity-type semiconductor layer 120, an active layer 130, an interface layer 140 and a second conductivity-type semiconductor layer 150 are disposed on a substrate 100.

The substrate 100 may be formed of a light-transmitting material, for example, one selected from the group consisting of sapphire ($Al_2O_3$), GaN, SiC, ZnO, Si, GaP, InP, $Ga_2O_3$, a conductive substrate and GaAs.

A buffer layer 110 serving to reduce lattice mismatch and a difference in coefficients of thermal expansion with the substrate 100 may be provided on the substrate 100. As the buffer layer 110, a layer or a pattern formed of a group II to VI compound semiconductor, for example, at least one selected from among the group consisting of an ZnO layer (not shown), a buffer layer (not shown) and an undoped semiconductor layer (not shown) may be used. The buffer layer and the undoped semiconductor layer may be formed of group III-V compound semiconductors. Further, the undoped semiconductor layer may be formed of an undoped GaN-based semiconductor.

The first conductivity-type semiconductor layer 120 may include only a first conductivity-type semiconductor layer or further include an undoped semiconductor layer under the first conductivity-type semiconductor layer, although the present invention is not limited thereto.

The first conductivity-type semiconductor layer 120 includes, for example, an N-type semiconductor layer, and the N-type semiconductor layer may be formed of a semiconductor material having a formula of $In_xAl_yGa_{1-x-y}N$ ($0 \le x \le 1$, $0 \le y \le 1$, $0 \le x+y \le 1$), for example, one selected from among the group consisting of GaN, AlN, AlGaN, InGaN, InN, InAlGaN and AlInN, and be doped with an N-type dopant, such as Si, Ge, Sn, Se and Te.

The undoped semiconductor layer (not shown) is configured to improve crystallinity of the first conductivity-type semiconductor layer 120, and may be identical to the first conductivity-type semiconductor layer 120 except that the undoped semiconductor layer is not doped with an N-type dopant and thus has electrical conductivity lower than the first conductivity-type semiconductor layer 120.

The active layer 130 may be disposed on the first conductivity-type semiconductor layer 120. The active layer 130 may be formed of, for example, a material having a formula of $In_xAl_yGa_{1-x-y}N$ ($0 \le x \le 1$, $0 \le y \le 1$, $0 \le x+y \le 1$), and include at least one selected from among the group consisting of a quantum wire structure, a quantum dot structure, a single quantum well structure and a multi-quantum well structure (MQW). The active layer 130 includes at least one combination of a well layer (not shown) of a first composition formed of a nitride-semiconductor material having first electronic energy and a barrier layer (not shown) of a second composition formed of a nitride-semiconductor material having higher electronic energy than the first electronic energy between the first conductivity-type semiconductor layer 120 and the second conductivity-type semiconductor layer 150, and may have a structure in which the well layer and the barrier layer are alternately stacked vertically.

The active layer 130 may generate light due to energy generated through recombination of electrons and holes provided from the first conductivity-type semiconductor layer 120 and the second conductivity-type semiconductor layer 150.

The interface layer 140 is provided on the active layer 130. The interface layer 140 may include a first layer, a second layer and a third layer having different energy bandgaps. In the interface layer 140, the first layer, the second layer and the third layer are sequentially stacked at least once in a direction from the active layer 130 to the second conductivity-type semiconductor layer 150, and the first layer may be further stacked on the third layer one more time.

FIG. 2 illustrates a structure in which the first layer, the second layer and the third layer are stacked once and then the first layer is additionally stacked thereon one more time.

However, in addition to the structure shown in FIG. 2, the interface layer 140 may is formed in a structure, such as a first layer/second layer/third layer/first layer/second layer/third layer/first layer structure or a first layer/second layer/third layer/first layer/second layer/third layer/first layer/second layer/third layer/first layer structure.

The first layer, the second layer and the third layer may be respectively formed of materials having a formula of $Al_xIn_yGa_{1-x-y}N$ (here, 0≤x,y≤1). At least one of the first layer, the second layer and the third layer may be a P-type nitride semiconductor layer doped with Mg.

The interface layer 140 may be doped with Mg or the first layer having the largest energy bandgap may be doped with Mg so as to function as a sufficiently thick energy barrier to electrons injected from the first conductivity-type semiconductor layer 120.

An in-plane lattice constant of at least one of the first layer, the second layer and the third layer forming the interface layer 140 may be equal or greater than an in-plane lattice constant of the barrier layer. Further, an average in-plane lattice constant of the interface layer 140 is greater than the in-plane lattice constant of the barrier layer in the active layer 130.

That is, when the in-plane lattice constant of the interface layer 140 is greater than the in-plane lattice constant of the barrier layer, the interface layer 140 reduces compressive stresses applied to quantum wells in the active layer 130 and thus increases a probability of combination between electrons and holes, thus causing increase in light emission efficiency.

The concrete formula of a nitride semiconductor ($Al_xIn_yGa_{1-x-y}N$, 0≤x,y≤1) constituting the interface layer 140 is obtained with reference to FIG. 4 which is a graph illustrating relations of an in-plane lattice constant with respect to bandgap energies of AlN—GaN—InN.

Gallium nitride (GaN) has bandgap energy of 3.4 eV and an in-plane lattice constant of 3.185 Å. Therefore, if the barrier layer of the active layer 130 has a formula of GaN, the formula of each of the first layer and the second layer may be selected from among a region expressed by oblique lines of FIG. 4, and thus each of the first layer and the second layer may have bandgap energy of 3.4~4.7 eV and an in-plane lattice constant of 3.185~3.2875 Å.

That is, if the barrier layer of the active layer 130 has the formula of GaN, the formulas of the first layer and the second layer may be determined such that the bandgap energies and in-plane lattice constants of the first layer and the second layer are equal to or greater than those of GaN.

The second conductivity-type semiconductor layer 150 may be disposed on the interface layer 140. The second conductivity-type semiconductor layer 150 includes, for example, a P-type semiconductor layer, and the P-type semiconductor layer may be formed of a semiconductor material having a formula of $In_xAl_yGa_{1-x-y}N$ (0≤x≤1, 0≤y≤1, 0≤x+y≤1), for example, one selected from among the group consisting of GaN, AlN, AlGaN, InGaN, InN, InAlGaN and AlInN, and be doped with a P-type dopant, such as Mg, Zn, Ca, Sr and Ba.

Here, differently from the above description, the first conductivity-type semiconductor layer 120 may include a P-type semiconductor layer and the second conductivity-type semiconductor layer 150 may include an N-type semiconductor layer. Further, a third conductivity-type semiconductor layer (not shown) including an N-type or P-type semiconductor layer may be formed on the first conductivity-type semiconductor layer 120. Thereby, the light emitting device in accordance with this embodiment may have at least one of np, pn, npn and pnp junction structures.

Further, doping concentrations of conductive dopants in the first conductivity-type semiconductor layer 120 and the second conductivity-type semiconductor layer 150 may be uniform or non-uniform. That is, the above plural semiconductor layers may be formed in various structures, although the present invention is not limited thereto.

A first electrode 160 and a second electrode 170 are respectively provided on the first conductivity-type semiconductor layer 120 and the second-conductivity-type semiconductor layer 150. Here, the first electrode 160 and the second electrode 170 may be respectively formed in a single layer structure or a multilayer structure including at least one selected from the group consisting of aluminum (Al), titanium (Ti), chrome (Cr), nickel (Ni), copper (Cu) and gold (Au).

From FIG. 4, it is understood that, when the barrier layer of the active layer 130 has a formula of GaN, each of the first layer and the second layer may have a formula of $Al_xIn_yGa_{1-x-y}N$ (here, 0≤y≤0.82, 0≤x0.43). That is, the region expressed by the oblique lines has the above formula.

In order to allow the interface layer 140 to achieve tunneling to holes and to function as a sufficient energy barrier layer to electrons, as will be described later, the first layer has a thickness of 1~10 nm and preferably 2~5 nm. Further, preferably, the sum total of thicknesses of the first layer and the second layer is more than 5 nm so as to prevent electron from penetrating the first and second layers due to quantum mechanical tunneling, and the sum total of thicknesses of the first layer, the second layer and the third layer is more than 10 nm.

Now, the function of the above-described light emitting device in accordance with the embodiment of the present invention will be described, as follows.

As shown in FIG. 2, energy bandgaps of the above-described interface layer 140 satisfy a relation of Eg(A)>Eg(B)>Eg(C). Here, Eg(A) means the energy bandgap of the first layer, Eg(B) means the energy bandgap of the second layer, and Eg(C) means the energy bandgap of the third layer.

The energy bandgap Eg(A) of the first layer and the energy bandgap Eg(B) of the second layer are greater than the energy bandgap of the barrier layer in the active layer 130, and the energy bandgap Eg(C) of the third layer is less than the energy bandgap of the second conductivity-type semiconductor layer 150. Further, the energy bandgap Eg(C) of the third layer may be less than the energy bandgap of the barrier layer in the active layer 130.

Holes injected from the second conductivity-type semiconductor layer 150 towards the active layer 130 first meet the second A layer (first layer). Since the A layer is thin, the holes effectively penetrate the A layer through a quantum mechanical tunneling process, and fill quantized energy levels formed in the C layer (third layer).

Then, the holes located at the quantized energy level (n=2) formed in the B layer (second layer) and the C layer penetrate the first A layer through quantum mechanical tunneling, and are moved to quantized energy levels formed in the third quantum well.

Therefore, the holes injected into the third quantum well are combined with electrons injected from the first conductivity-type semiconductor layer 120 into the active layer 130, thus emitting light.

Here, the interface layer 140 functions as an electron blocking layer, and thus in the case of holes, the holes may be effectively injected into the active layer 130 through quantum mechanical tunneling via the interface layer 140 serving as a thin energy barrier layer to the holes.

However, in the case of electrons, quantum mechanical tunneling of the electrons via the interface layer 140 serving as a sufficiently thick energy barrier layer to the electrons is difficult and thus leakage of electrons may be minimized.

Figure 3:
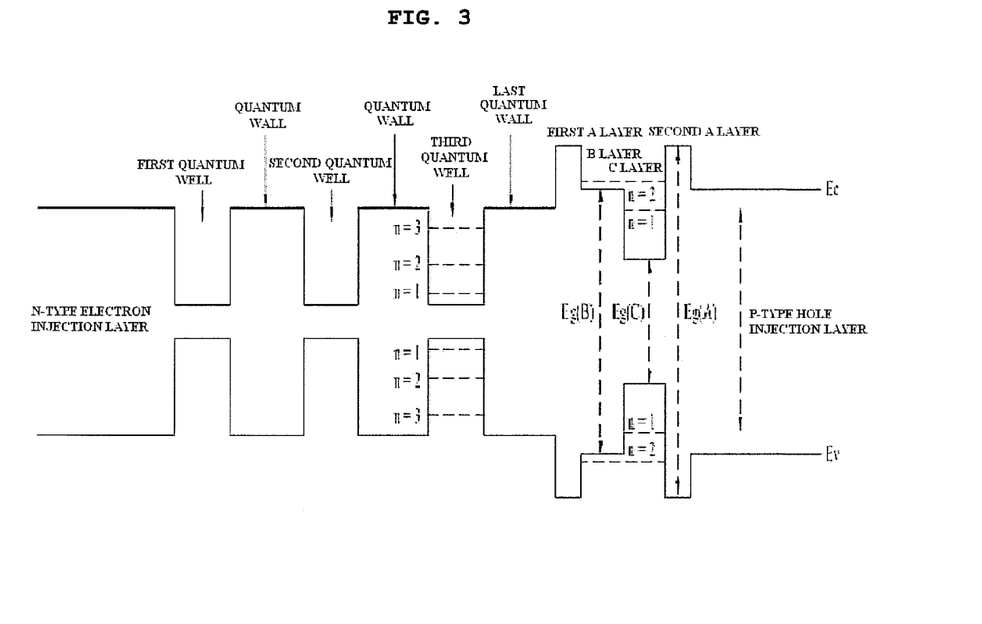
FIG. 3 is a schematic view illustrating an energy bandgap of a light emitting device in accordance with another embodiment of the present invention.

FIG. 3 is a schematic view illustrating an energy bandgap of a light emitting device in accordance with another embodiment of the present invention. Hereinafter, the light emitting device in accordance with this embodiment of the present invention will be described with reference to FIGS. 1, 3 and 4.

The light emitting device in accordance with this embodiment is fundamentally the same as the light emitting device in accordance with the embodiment of FIG. 2, but further includes a barrier layer between the active layer 130 and the interface layer 140. For convenience, the barrier layer provided between the active layer 130 and the interface layer 140 is referred to as the last barrier layer.

Here, holes injected from the second conductivity-type semiconductor layer 150 towards the active layer 130 first meet the second A layer. Since the A layer is thin, and thus the holes effectively penetrate the A layer through the quantum mechanical tunneling process, and fill quantized energy levels formed in the C layer.

Then, the holes located at the quantized energy level (n=2) formed in the B layer and the C layer penetrate the first A layer through quantum mechanical tunneling, pass through the last barrier layer, and are injected into the last quantum well (the third quantum well in FIG. 3). The holes injected into the third quantum well are combined with electrons injected from the first conductivity-type semiconductor layer 120 into the active layer 130, thus emitting light.

Although this embodiment divisionally illustrates the second conductivity-type semiconductor layer 150 and the interface layer 140, this is done only to achieve effective illustration and the second conductivity-type semiconductor layer 150 and the interface layer 140 are not limited thereto.

That is, the interface layer 140 may be a part of the second conductivity-type semiconductor layer 150.

Figure 5:
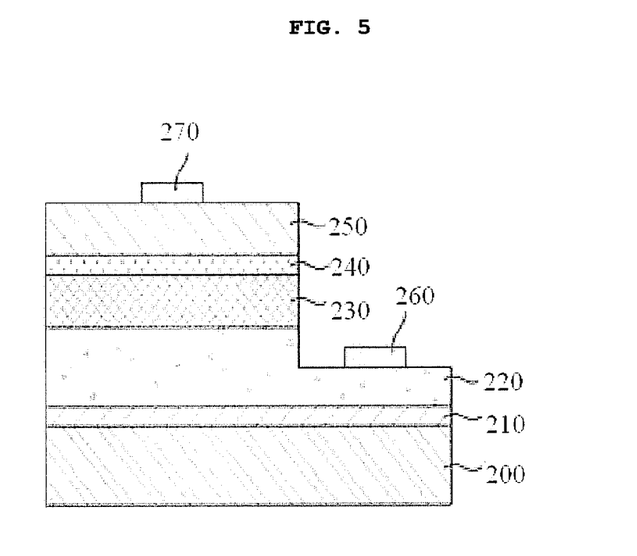
FIG. 5 is a cross-sectional view illustrating a light emitting device in accordance with another embodiment of the present invention.
Figure 6:
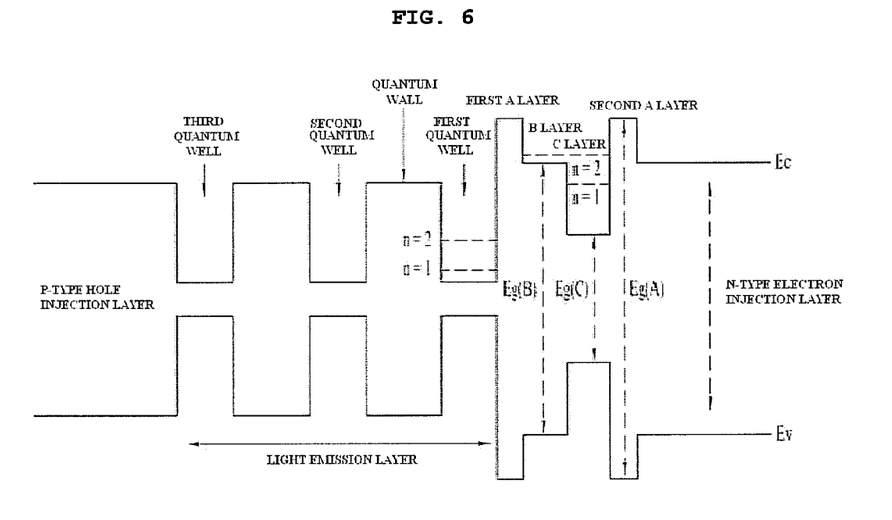
FIG. 6 is a schematic view illustrating an energy bandgap of the light emitting device in accordance with the embodiment of the present invention.

FIG. 5 is a cross-sectional view illustrating a light emitting device in accordance with another embodiment of the present invention, FIG. 6 is a schematic view illustrating an energy bandgap of the light emitting device in accordance with the embodiment of the present invention, and FIG. 4 is a graph illustrating characteristics of a nitride in an interface layer of the light emitting device. Hereinafter, the light emitting device in accordance with this embodiment of the present invention will be described with reference to FIGS. 5, 6 and 4.

As shown in FIGS. 5, 6 and 4, a first conductivity-type semiconductor layer 220, an interface layer 230, an active layer 240 and a second conductivity-type semiconductor layer 250 are disposed on a substrate 200.

Differently from the former embodiments, the first conductivity-type semiconductor layer 220 may include a P-type semiconductor layer and the second conductivity-type semiconductor layer 250 may include an N-type semiconductor layer.

As shown in FIG. 6, energy bandgaps of the above-described interface layer 230 satisfy a relation of Eg(A)>Eg(B)>Eg(C). Here, Eg(A) means the energy bandgap of the first layer, Eg(B) means the energy bandgap of the second layer, and Eg(C) means the energy bandgap of the third layer.

The energy bandgap Eg(A) of the first layer and the energy bandgap Eg(B) of the second layer is greater than the energy bandgap of the barrier layer in the active layer 240, and the energy bandgap Eg(C) of the third layer is equal to or less than the energy bandgap of the first conductivity-type semiconductor layer 220. Further, the energy bandgap Eg(C) of the third layer may be less than the energy bandgap of the barrier layer in the active layer 240.

A large amount of forward electrons injected from the first conductivity-type semiconductor layer 220 towards the active layer 240 first meet the second A layer (first layer). Since the A layer is thin, the electrons effectively penetrate the A layer through the quantum mechanical tunneling process, and fill quantized energy levels formed in the C layer (third layer).

Then, the electrons located at the quantized energy level (n=2) formed in the B layer (second layer) and the C layer penetrate the first A layer through quantum mechanical tunneling, and are moved to quantized energy levels formed in the first quantum well.

Here, electrons injected into the quantum wells are combined with the holes injected from the second conductivity-type semiconductor layer 250 into the active layer 249, thus emitting light. When reverse voltage is applied, a small amount of electrons present in the first quantum well meet a high and thick energy barrier including the A layer and B layer, and thus reverse leakage current is effectively prevented.

Figure 7:
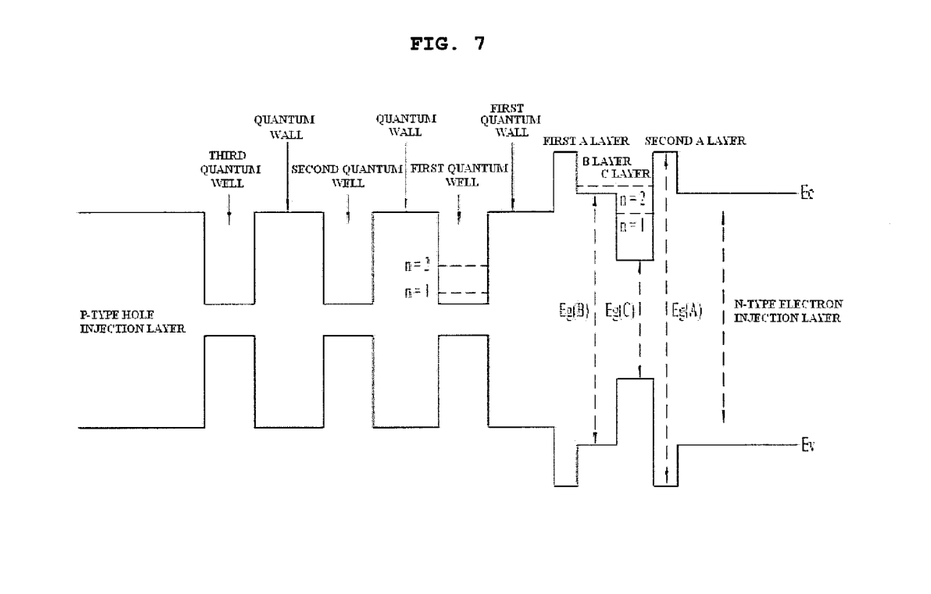
FIG. 7 is a schematic view illustrating an energy bandgap of a light emitting device in accordance with another embodiment of the present invention.

FIG. 7 is a schematic view illustrating an energy bandgap of a light emitting device in accordance with another embodiment of the present invention. Hereinafter, the light emitting device in accordance with this embodiment of the present invention will be described with reference to FIGS. 5, 7 and 4.

The light emitting device in accordance with this embodiment is fundamentally the same as the light emitting device in accordance with the embodiment of FIGS. 5 and 6, but further includes a barrier layer between the active layer 240 and the interface layer 230. For convenience, the barrier layer provided between the active layer 240 and the interface layer 230 is referred to as a first barrier layer.

Here, when forward voltage is applied, a large amount of forward electrons having penetrated the first A layer pass through the first barrier layer and are injected into the first quantum well. However, when reverse voltage is applied, a small amount of electrons present in the first quantum well escape the first quantum well, pass through the first barrier layer and meet a high and thick energy barrier including the A layer and B layer, and thus reverse leakage current is effectively prevented.

Although this embodiment divisionally illustrates the first conductivity-type semiconductor layer 220 and the interface layer 230, this is done only to achieve effective illustration and the first conductivity-type semiconductor layer 220 and the interface layer 230 are not limited thereto.

That is, the interface layer 230 may be a part of the first conductivity-type semiconductor layer 220.

Although the embodiments exemplarily illustrate the horizontal-type light emitting device, the present invention is not limited thereto. That is, the embodiments may be applied to, in addition to the horizontal-type light emitting device, all light emitting devices to which an active layer may be applied to, such as a vertical-type light emitting device, a flip chip light emitting device and a light emitting device having a via hole structure.

Figure 8:
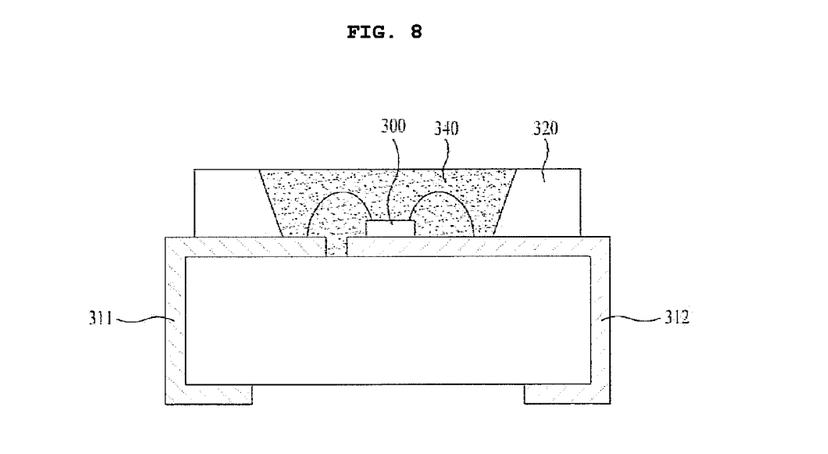
FIG. 8 is a cross-sectional illustrating a light emitting device package in accordance with one embodiment of the present invention.

FIG. 8 is a cross-sectional illustrating a light emitting device package in accordance with one embodiment of the present invention. Hereinafter, the light emitting device package in accordance with this embodiment of the present invention will be described with reference to FIG. 8.

As shown in FIG. 8, the light emitting device package in accordance with this embodiment includes a package body 320, a first electrode layer 311 and a second electrode layer 312 installed on the package body 320, a light emitting device 300 in accordance with one embodiment of the present invention which is installed on the package body 320 and electrically connected to the first electrode layer 311 and the second electrode layer 312, and a molding material 340 surrounding the light emitting device 300.

The package body 320 may be formed of silicon, synthetic resin or metal, and be provided with inclined surfaces around the light emitting device 300 so as to increase light extraction efficiency.

The first electrode layer 311 and the second electrode layer 312 are electrically insulated from each other, and provide power to the light emitting device 300. Further, the first electrode layer 311 and the second electrode layer 312 may serve to reflect light generated from the light emitting device 300 to increase light efficiency and to discharge the light generated from the light emitting device 300 to the outside.

The light emitting device 300 may be installed on the package body 320 or installed on the first electrode layer 311 or the second electrode layer 312.

The light emitting device 300 may be electrically connected to the first electrode layer 311 and the second electrode layer 312 through one out of a wire-bonding method, a flip chip-bonding method or a die-bonding method.

The molding material 340 may surround the light emitting device 300 to protect the light emitting device 300. Further, the molding material 340 may include a phosphor, thus varying a wavelength of light emitted from the light emitting device 300.

The above light emitting device package may include at least one light emitting device or plural light emitting devices from among the above-described light emitting devices in accordance with the former embodiments, but is not limited thereto.

An array of a plurality of light emitting device packages in accordance with this embodiment may be mounted on a substrate, and optical members, such as a light guide panel, a prism sheet, a diffusion sheet, etc., may be disposed on an optical path of the light emitting device packages. The light emitting device packages, the substrate and the optical members may function as a light unit. In accordance with another embodiment, the light emitting devices or the light emitting device package in accordance with the above-described embodiments may be implemented as a display device, an indicating device or a lighting system, and the lighting system may include, for example, a lamp or a streetlight.

Figure 9:
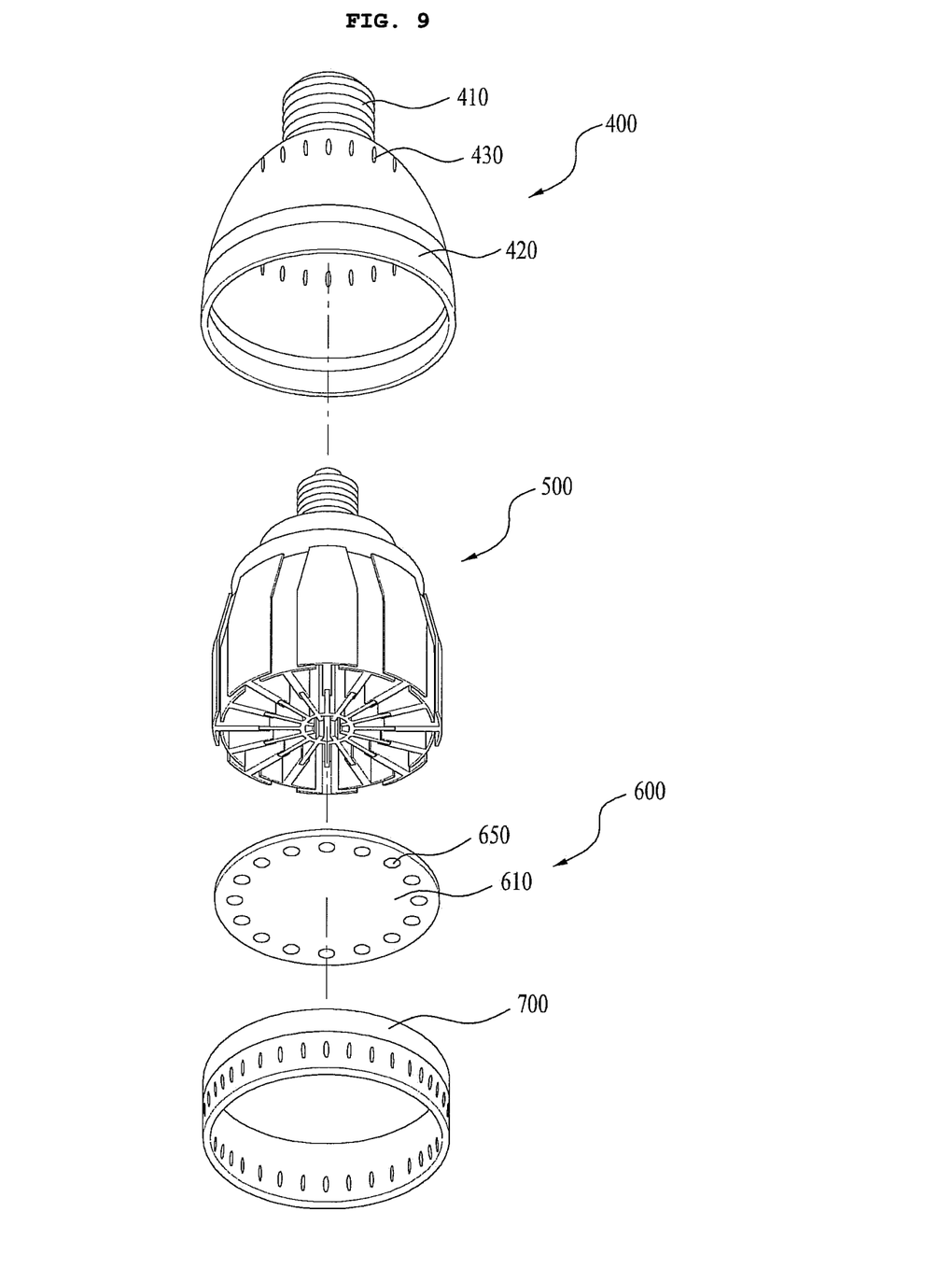
FIG. 9 is an exploded perspective view of a lighting apparatus including a light emitting device module in accordance with one embodiment of the present invention.

Hereinafter, as a lighting system in which the above-described light emitting device packages are disposed, a lighting apparatus and a backlight unit will be described. FIG. 9 is an exploded perspective view of a lighting apparatus including a light emitting device module in accordance with one embodiment of the present invention; and The lighting apparatus in accordance with this embodiment includes a light source 600 to project light, a housing 400 in which the light source 600 is installed, a heat dissipation unit 500 to discharge heat generated by the light source 600, and a holder 700 to connect the light source 600 and the heat dissipation unit 500 to the housing 400.

The housing 400 includes a socket connector 410 connected to an electrical socket (not shown) and a body 420 connected to the socket connector 410 and accommodating the light source 600. One air flow hole 430 may be formed through the body 420.

In this embodiment, a plurality of air flow holes 430 is provided on the body 420 of the housing 400. One air flow hole 430 may be formed, or plural air flow holes 430 may be arranged in a radial shape, as shown in FIG. 9, or various other shapes.

The light source 600 includes a plurality of light emitting device packages 650 on a circuit board 610. Here, the circuit board 610 may have a shape which is capable of being inserted into an opening of the housing 400, and be formed of a material having high thermal conductivity so as to transfer heat to the heat dissipation unit 500, as described later.

The holder 700 is provided under the light source 600. The holder 700 may include a frame and air flow holes. Further, although not shown in FIG. 9, optical members may be provided under the light source 600 so as to diffuse, scatter or converge light emitted from the light emitting device packages 650 of the light source 600.

The above-described lighting apparatus includes the above-described light emitting device module or light emitting device packages, and prevents damage to light emitting devices due to thermal expansion of the light emitting device packages.

Figure 10:
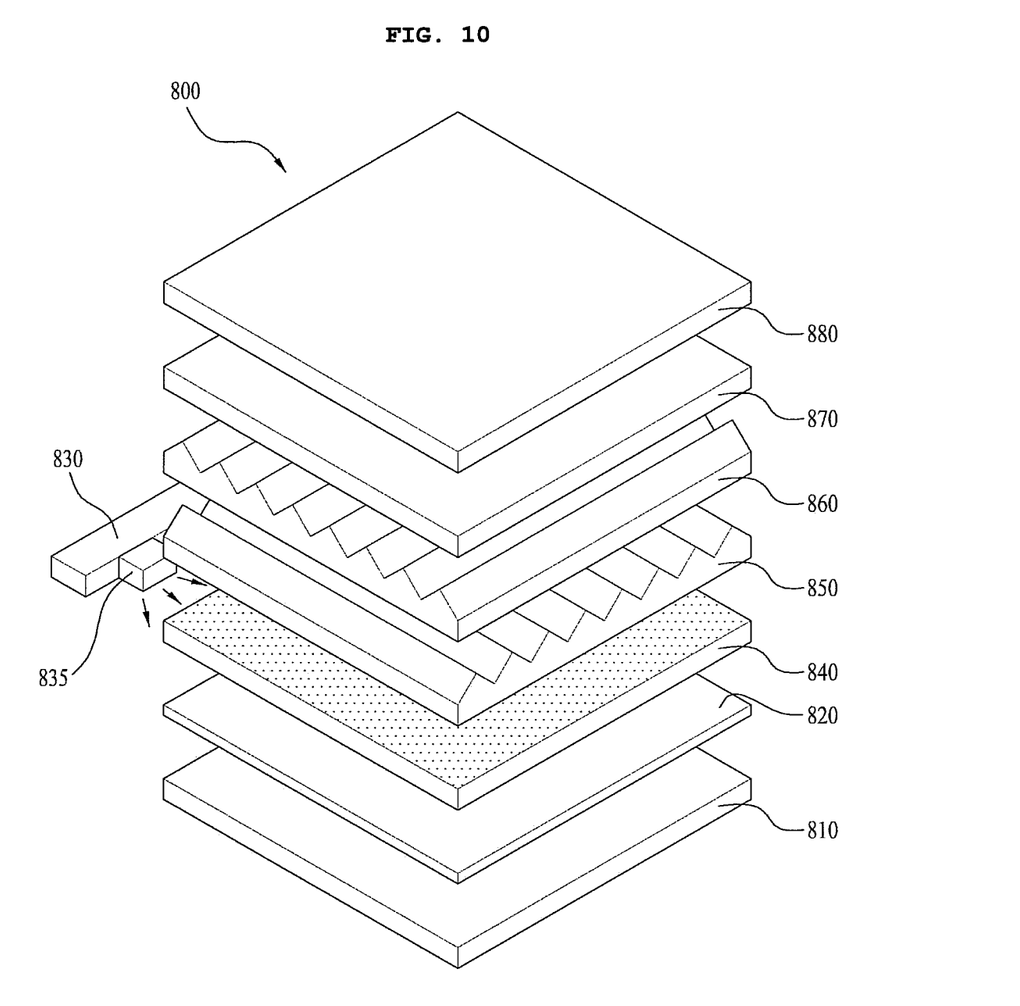
FIG. 10 is an exploded perspective view of a backlight unit including a light emitting device module in accordance with one embodiment of the present invention.

FIG. 10 is an exploded perspective view of a backlight unit including a light emitting device module in accordance with one embodiment of the present invention.

As shown in FIG. 10, a display device 800 in accordance with this embodiment includes a light source module 830 and 835, a reflective plate 820 disposed on a bottom cover 810, a light guide panel 840 disposed in front of the reflective plate 820 to guide light emitted from the light source module 830 and 835 to the front part of the display device, a first prism sheet 850 and a second prism sheet 860 disposed in front of the light guide panel 840, a panel 870 disposed in front of the second prism sheet 860, and a color filter 880 disposed in front of the panel 870.

The light source module 830 and 835 includes a circuit board 830 and light emitting device packages 835. Here, a PCB may be used as the circuit board 830, and the above-described light emitting device packages may be used as the light emitting device packages 835.

The bottom cover 810 may receive elements of the display device 800. The reflective plate 820 may be provided as a separate element, as shown in FIG. 10, or be provided by coating the rear surface of the light guide panel 840 or the front surface of the bottom cover 810 with a material having high reflectivity.

Here, the reflective plate 820 may be formed of a material having high reflectivity and usable as an ultra-thin type, such as polyethylene terephthalate (PET).

The light guide panel 830 scatters light emitted from the light emitting device packages 835 so as to uniformly distribute the light throughout the entirety of a screen of the liquid crystal display device. Therefore, the light guide panel 830 is formed of a material having a high index of refraction and high transmittance, such as polymethylmethacrylate (PMMA), polycarbonate (PC) or polyethylene (PE).

The first prism sheet 850 is formed by applying a polymer having light transmittance and elasticity to one surface of a base film, and the polymer may form a prism layer in which a plurality of three-dimensional structures is repeated. Here, such plural three-dimensional structures may form a stripe pattern in which ridges and valleys are repeated, as shown in FIG. 10.

The arrangement direction of ridges and valleys on one surface of a base film of the second prism sheet 860 may be perpendicular to the arrangement direction of the ridges and valleys on one surface of the base film of the first prism sheet 850. This is done to uniformly disperse light transmitted from the light source module and the reflective sheet 820 in all directions of the panel 870.

Although not shown in the drawings, a protective sheet may be provided on each of the first and second prism sheets 850 and 860. The protective sheet is provided with protective layers, including light-diffusing particles and a binder, on both surfaces of a base film.

Further, the prism layer may be formed of a polymer selected from the group consisting of polyurethane, styrene-butadiene copolymers, polyacrylate, polymethacrylate, polymethyl methacrylate, polyethylene terephthalate elastomers, polyisoprene and polysilicon.

A diffusion sheet (not shown) may be disposed between the light guide panel 840 and the first prism sheet 850. The diffusion sheet may be formed of a polyester or polycarbonate-based material and maximally increase a light projection angle through refraction and scattering of light incident from the backlight unit.

Further, the diffusion sheet includes a support layer including light diffusing agents, and a first layer and a second layer formed on a light emitting surface (in the direction of the first prism sheet) and a light incident surface (in the direction of the reflective sheet) and excluding a light diffusing agent.

The support layer may include 0.1~10 parts by weight of a siloxane-based light diffusing agent having an average particle diameter of 1~10 μm and 0.1~10 parts by weight of a acryl-based light diffusing agent having an average particle diameter of 1~10 μm, with respect to 100 parts by weight of a resin in which a methacrylic acid-styrene copolymer and a methacrylic acid methyl-styrene copolymer are mixed.

Each of the first layer and the second layer may include 0.01~1 parts by weight of an ultraviolet absorber and 0.001~10 parts by weight of an antistatic agent, with respect to 100 parts by weight of a methacrylic acid methyl-styrene copolymer.

The support layer of the diffusion sheet may have a thickness of 100~10,000 μm, and each of the first and second layers may have a thickness of 10~1,000 μm.

Although this embodiment illustrates the diffusion sheet, the first prism sheet 850 and the second prism sheet 860 as forming optical sheets, the optical sheets may have other combinations, i.e., a micro-lens array, a combination of the diffusion sheet and the micro-lens array, and a combination of one prism sheet and the micro-lens array.

A liquid crystal display panel may be used as the panel 870. Further, instead of the liquid crystal display panel, other kinds of display devices requiring light sources may be provided.

The panel 870 is configured such that a liquid crystal layer is located between glass substrates and polarizing plates are mounted on both glass substrates so as to utilize polarizing properties of light. Here, the liquid crystal layer has properties between a liquid and a solid. That is, in the liquid crystal layer, liquid crystals which are organic molecules having fluidity, like a liquid, are regularly aligned like crystals, and thus the liquid crystal layer displays an image using change of such molecular alignment due to an external electric field.

The liquid crystal display panel used in the display device is of an active matrix type, and uses transistors as switches to adjust voltage applied to each pixel.

Further, the color filter 880 is provided on the front surface of the panel 870, and transmits only R, G and B light among light projected from the panel 870 at each pixel, thereby displaying an image.

The above-described backlight unit includes the above-described light emitting device module or light emitting device packages, and prevents damage to light emitting devices due to thermal expansion of the light emitting device packages.

As apparent from the above description, a light emitting device and a light emitting device package in accordance with one embodiment of the present invention improve light emission efficiency.

The above-described features, structures and effects described in the embodiments are implemented by at least one embodiment of the present invention, but are not limited to one embodiment. Further, it will be apparent to those skilled in the art that the features, structures and effects described in each embodiment can be combined with those in other embodiments or be modified. Thus, it is intended that these combinations and modifications come within the scope of the embodiments.

It will be apparent to those skilled in the art that various modifications and variations can be made in the embodiments without departing from the spirit or scope of the embodiments. Thus, it is intended that the embodiments cover the modifications and variations of these embodiments provided they come within the scope of the appended claims and their equivalents.

What is claimed is:

1. A light emitting device comprising:
a light emitting structure including a first conductivity-type semiconductor layer, a second conductivity-type semiconductor layer, and an active layer including at least one combination of a well layer of a first composition formed of a nitride-semiconductor material having first electronic energy and a barrier layer of a second composition formed of a nitride-semiconductor material having higher electronic energy than the first electronic energy between the first conductivity-type semiconductor layer and the second conductivity-type semiconductor layer; and
an interface layer disposed between the second conductivity-type semiconductor layer and the active layer or between the first conductivity-type semiconductor layer and the active layer, wherein:
the interface layer includes a first layer, a second layer and a third layer having different energy bandgaps, the first layer, the second layer and the third layer of the interface layer are sequentially disposed in a direction from the active layer towards the second conductivity-type semiconductor layer or the first conductivity-type semiconductor layer, the energy bandgaps of the first layer and the second layer are greater than the energy bandgap of the barrier layer in the active layer, the energy bandgaps of the first layer is greater than the energy band gap of the second layer, and the energy bandgap of the third layer is less than the energy bandgap of the barrier layer in the active layer.

2. The light emitting device according to claim 1, wherein the energy bandgap of the first layer is greater than the energy bandgap of the second layer.

3. The light emitting device according to claim 1, wherein an in-plane lattice constant of at least one of the first layer, the second layer and the third layer is greater than an in-plane lattice constant of the barrier layer in the active layer.

4. The light emitting device according to claim 1, wherein an in-plane lattice constant of at least one of the first layer, the second layer and the third layer is equal to an in-plane lattice constant of the barrier layer in the active layer.

5. The light emitting device according to claim 1, wherein an average in-plane lattice constant of the interface layer is greater than an in-plane lattice constant of the barrier layer in the active layer.

6. The light emitting device according to claim 1, wherein an average in-plane lattice constant of the interface layer is equal to an in-plane lattice constant of the barrier layer in the active layer.

7. The light emitting device according to claim 1, wherein the first layer is further disposed after the first layer, the second layer and the third layer are sequentially disposed.

8. The light emitting device according to claim 1, wherein the first layer of the interface layer contacts the active layer.

9. The light emitting device according to claim 1, further comprising a barrier layer provided between the active layer and the interface layer.

10. The light emitting device according to claim 1, wherein each of the first layer, the second layer and the third layer has a formula of $Al_xIn_yGa_{1-x-y}N$ (here, $0 \le x, y \le 1$).

11. The light emitting device according to claim 1, wherein each of the first layer and the second layer has an energy bandgap of 3.4~4.7 eV.

12. The light emitting device according to claim 1, wherein each of the first layer and the second layer has an in-plane lattice constant of 3.185~3.2875 Å.

13. The light emitting device according to claim 1, wherein the first layer has a thickness of 1~10 nm.

14. The light emitting device according to claim 1, wherein the sum total of thicknesses of the first layer and the second layer is more than 5 nm.

15. The light emitting device according to claim 1, wherein the sum total of thicknesses of the first layer, the second layer and the third layer is more than 10 nm.

16. The light emitting device according to claim 1, wherein the first conductivity-type semiconductor layer is an N-type semiconductor layer and the second conductivity-type semiconductor layer is a P-type semiconductor layer, or the first conductivity-type semiconductor layer is a P-type semiconductor layer and the second conductivity-type semiconductor layer is an N-type semiconductor layer.

17. The light emitting device according to claim 10, wherein each of the first layer and the second layer has a formula of $Al_xIn_yGa_{1-x-y}N$ (here, $0 \le y \le 0.82$, $0 \le x \le 0.43$).

18. A light emitting device comprising:

a light emitting structure including a first conductivity-type semiconductor layer, a second conductivity-type semiconductor layer, and an active layer including at least one combination of a well layer of a first composition formed of a nitride-semiconductor material having first electronic energy and a barrier layer of a second composition formed of a nitride-semiconductor material having higher electronic energy than the first electronic energy between the first conductivity-type semiconductor layer and the second conductivity-type semiconductor layer; and an interface layer disposed between the second conductivity-type semiconductor layer and the active layer or between the first conductivity-type semiconductor layer and the active layer, wherein:

the interface layer includes a first layer, a second layer, and the third layer having different energy band gaps, the energy band gaps of the first layer and the second layer are greater than the energy band gap of the barrier layer in the active layer, the energy band gap of the third layer is less than the energy band gap of the barrier layer in the active layer, the first layer, the second layer and the third layer are sequentially disposed in a direction from the active layer towards the second conductivity-type semiconductor layer or the first conductivity-type semiconductor layer, and another first layer is further disposed after the first layer, the second layer and the third layer are sequentially disposed.

19. A light emitting device comprising:

a light emitting structure including a first conductivity-type semiconductor layer, a second conductivity-type semiconductor layer, and an active layer including at least one combination of a well layer of a first composition formed of a nitride-semiconductor material having first electronic energy and a barrier layer of a second composition formed of a nitride-semiconductor material having higher electronic energy than the first electronic energy between the first conductivity-type semiconductor layer and the second conductivity-type semiconductor layer; and an interface layer disposed between the second conductivity-type semiconductor layer and the active layer or between the first conductivity-type semiconductor layer and the active layer, wherein:

the interface layer includes a first layer, a second layer and a third layer having different energy band gaps, the energy band gaps of the first layer and the second layer are greater than the energy bandgap of the barrier layer in the active layer, the energy band gap of the third layer is less than the energy bandgap of the barrier layer in the active layer, and an in-plane lattice constant of at least one of the first layer, the second layer and the third layer is greater than or equal to an in-plane lattice constant of the barrier layer in the active layer.

20. The light emitting device according to claim 19, wherein an average in-plane lattice constant of the interface layer is greater than or equal to an in-plane lattice constant of the barrier layer in the active layer.

* * * * *